(12) United States Patent  (10) Patent No.: US 8,476,084 B1
Yang et al.                 (45) Date of Patent:     Jul. 2, 2013

(54) METHOD AND STRUCTURE OF SENSORS OR ELECTRONIC DEVICES USING VERTICAL MOUNTING

(75) Inventors: Xiao "Charles" Yang, Cupertino, CA (US); Hong Wan, Plymouth, MN (US)

(73) Assignee: Mcube Inc., San Jose, CA (US)

( * ) Notice: Subject to any disclaimer, the term of this patent is extended or adjusted under 35 U.S.C. 154(b) by 141 days.

(21) Appl. No.: 13/113,883

(22) Filed: May 23, 2011

Related U.S. Application Data

(60) Provisional application No. 61/347,805, filed on May 24, 2010.

(51) Int. Cl.
 *H01L 21/00* (2006.01)
(52) U.S. Cl.
 USPC .............. 438/3; 438/51; 257/E21.502
(58) Field of Classification Search
 USPC ............................ 438/51, 114, 617
 See application file for complete search history.

(56) References Cited

U.S. PATENT DOCUMENTS

| | | | |
|---|---|---|---|
| 6,188,322 B1 | 2/2001 | Yao et al. | |
| 6,979,872 B2 | 12/2005 | Borwick et al. | |
| 7,095,226 B2 * | 8/2006 | Wan et al. | 324/247 |
| 7,521,783 B2 * | 4/2009 | Tsai et al. | 438/57 |
| 2004/0016995 A1 | 1/2004 | Kuo et al. | |
| 2004/0227201 A1 | 11/2004 | Borwick, III et al. | |
| 2005/0252293 A1 | 11/2005 | Wong et al. | |
| 2008/0014682 A1 | 1/2008 | Yang et al. | |
| 2011/0265574 A1 | 11/2011 | Yang | |

OTHER PUBLICATIONS

Office Action for U.S. Appl. No. 12/945,087, mailed on Mar. 19, 2012, 6 pages.
International Search Report and Written Opinion of PCT Application No. PCT/US10/054567, mailed on Jan. 6, 2011, 7 pages total.

* cited by examiner

*Primary Examiner* — Chandra Chaudhari
(74) *Attorney, Agent, or Firm* — Kilpatrick Townsend & Stockton LLP

(57) ABSTRACT

A method and structure for fabricating sensor(s) or electronic device(s) using vertical mounting is presented. The method includes providing a substrate having a surface region and forming sensor(s) or electronic device(s) on a first region overlying the surface region. At least one bond pad structure can be formed from at least one trench structure. The resulting device can then be singulated within a vicinity of the bond pad structure(s) to form at least one integrated sensor or electronic devices having at least one vertical bond pad. At least one singulated device(s) can be coupled to a package, having a package surface region, such that the vertical bond pad(s) are configured horizontally, and at least one interconnection can be formed between the vertical bond pad(s) and at least one portion of the package surface region.

22 Claims, 16 Drawing Sheets

METHOD AND STRUCTURE OF SENSORS OR ELECTRONIC DEVICES USING VERTICAL MOUNTING

CROSS-REFERENCES TO RELATED APPLICATIONS

The present application claims priority to and incorporates by reference, for all purposes, the following patent application: U.S. Pat. App. No. 61/347,805, filed May 24, 2010. The present invention also incorporates by reference, for all purposes, the following co-pending patent applications: U.S. patent application Ser. No. 12/859,631, filed Aug. 19, 2010, U.S. patent application Ser. No. 12/490,067, filed Jun. 23, 2009, U.S. patent application Ser. No. 12/945,087, filed Nov. 12, 2010, and U.S. patent application Ser. No. 12/913,440, filed Oct. 27, 2010.

BACKGROUND OF THE INVENTION

Embodiments of the present invention relates generally to integrated devices. More particularly, embodiments of the present invention provides a method for fabricating sensors or electronic devices using vertical mounting as well as a device using vertical mounting. More specifically, embodiments of the present invention provides a method for forming a dielectric material and a conduction material overlying one or more integrated micro electro-mechanical systems, commonly termed "MEMS" or devices formed overlying a substrate as well as the resulting device. Merely by way of example, the integrated device can include at least an accelerometer, an angular rate sensor, a magnetic field sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS technology has limitless applications through modular measurement devices such as accelerometers, angular rate sensors, actuators, and other sensors. In conventional vehicles, accelerometers and angular rate sensors are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

According to embodiments the present invention, techniques related generally to integrated devices and systems are provided. More particularly, embodiments of the present invention provide a method for fabricating sensors or electronic devices using vertical mounting as well as a device using vertical mounting. More specifically, embodiments of the present invention provide a method for forming a dielectric material and a conduction material overlying at least one sensor or integrated electronic device formed overlying a substrate, singulating the resulting device, coupling the singulated device on a package, and forming interconnections between the singulated device and the package. Merely by way of example, the integrated devices can include one or more of an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

A specific embodiment provides a method for fabricating sensors or electronic devices using vertical mounting as well as a device using vertical mounting. The method includes providing a substrate having a surface region and forming at least one sensor or integrated electronic device on a first region overlying the surface region. The sensor(s) or integrated electronic device(s) can have one or more contact regions. The first region can also have a first surface region. At least one trench structure can be formed within at least one portion of the first region. A dielectric material can be formed overlying the first region and the trench structure(s). At least one portion of the dielectric material can be removed within a vicinity of the contact region(s). A conduction material can be formed overlying the dielectric material, the trench structure(s), and the contact region(s). At least one portion of the conduction material can be removed within a vicinity of the contact region(s) to form at least one bonding structure. The resulting device can then be singulated within a vicinity of the bonding structure(s) to form at least one singulated integrated device. The singulated integrated device(s) can have at least one vertical bond pad. The singulated device(s) can be coupled to a package, having a package surface region, such that the vertical bond pad(s) are configured horizontally. At least one interconnection can be formed between the vertical bond pad(s) and at least one portion of the package surface region.

Another specific embodiment provides a method for fabricating an integrated device using vertical mounting as well as a system using vertical mounting. The method includes providing a substrate having a surface region and forming at least one sensor or integrated electronic device on a first region overlying the surface region. The integrated devices can have one or more contact regions and one or more sensors and/or electronic devices. The electronic devices can include CMOS integrated circuit devices. The sensors can include MEMS devices and/or magnetoresistive devices. The first region can also have a first surface region.

At least one trench structure can be formed within at least one portion of the first region. In some embodiments, the trench structures can be formed via a deep reactive-ion etching (DRIE) process. In a specific embodiment, after etching, the resulting trench structure can have trench sidewalls with slopes that are greater than 90 degrees. A dielectric material can be formed overlying the first region and the trench structures. At least one portion of the dielectric material can be removed within a vicinity of the contact regions. A conduction material can be formed overlying the dielectric material, the trench structures, and the contact regions. At least one portion of the conduction material can be removed within a vicinity of the contact regions to form at least one bonding structure.

The resulting device can then be singulated within a vicinity of the bonding structures to form at least one singulated integrated device. The singulated integrated devices can have at least one vertical bond pad. The singulated devices can be coupled to a package, having a package surface region, such that the vertical bond pads are configured horizontally. At least one interconnection can be formed between the vertical bond pads and at least one portion of the package surface region.

Many benefits are achieved by way of the present invention over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. Preferably, the invention provides for an improved MEMS device system and related applications for a variety of uses. In one or more embodiments, the present invention provides for all MEMS and related applications, which may be integrated on one or more CMOS device structures. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to embodiments of the present invention, techniques related generally to integrated devices and systems are provided. More particularly, embodiments of the present invention provide a method and structure for fabricating sensors or electronic devices using vertical mounting. More specifically, embodiments of the present invention provide a method for forming a dielectric material and a conduction material overlying at least one sensor or integrated electronic device formed overlying a substrate, singulating the resulting device, coupling the singulated device on a package, and forming interconnections between the singulated device and the package. Merely by way of example, the sensors or integrated electronic devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

Figure 1:
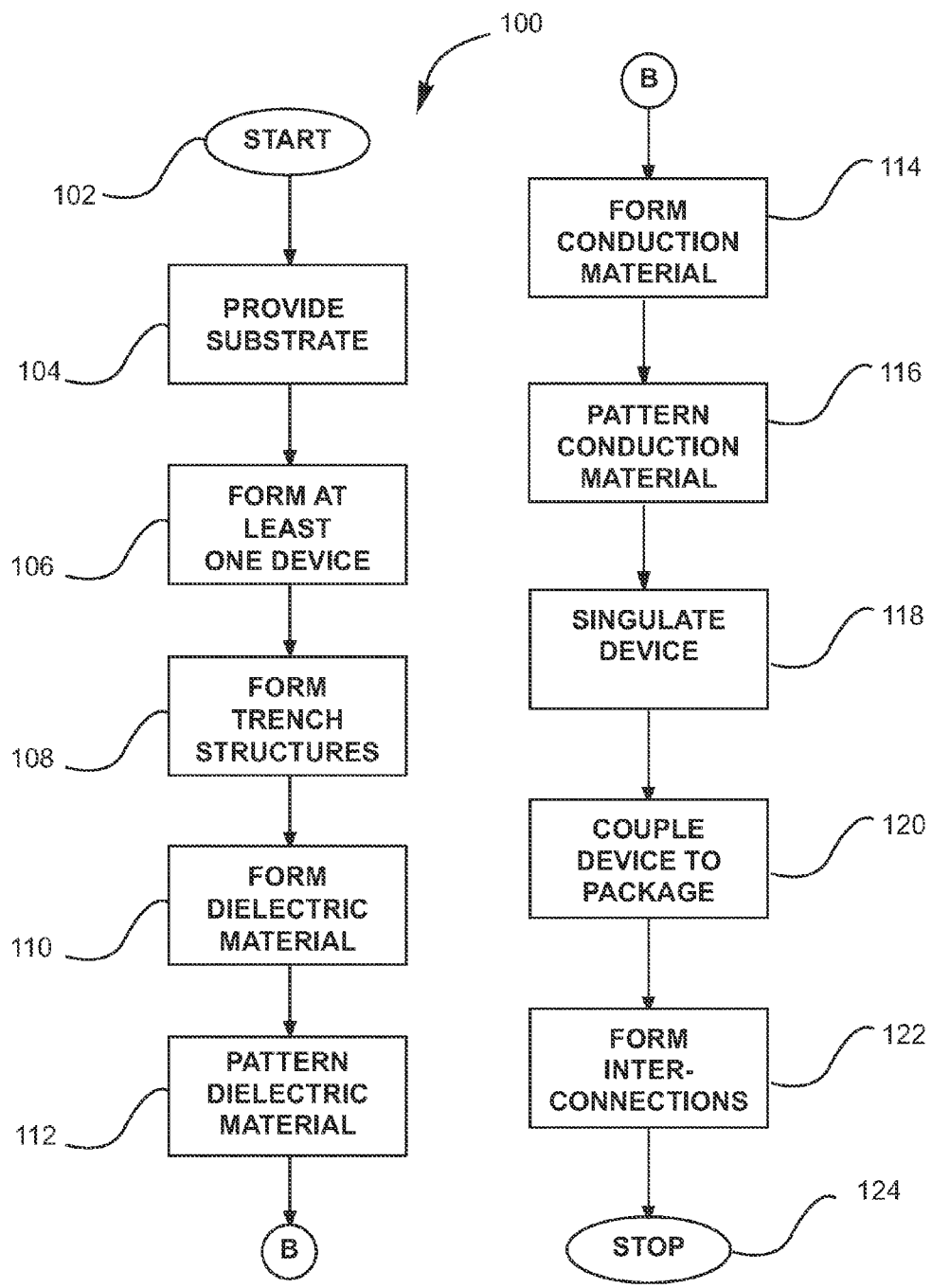
FIG. 1 is a simplified flow diagram of a method for fabricating sensors or electronic devices according to an embodiment of the present invention.

FIG. 1 is a simplified flow diagram illustrating a method of fabricating sensors or electronic devices using vertical mounting according to an embodiment of the present invention. This diagram is merely an example, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

As shown in FIG. 1, the present method can be briefly outlined below.

1. Start;
2. Provide a substrate having a surface region;
3. Form at least one sensor or device within a first region overlying the surface region;
4. Form at least one trench structure within the first region;
5. Form a dielectric material overlying the first region;
6. Remove at least one portion of the dielectric material;
7. Form a conduction material overlying the dielectric material;
8. Remove one or more portions of the conduction material;
9. Singulate resulting device;
10. Couple the singulated device to a package;
11. Form at least one interconnection between singulated device and package;
12. Stop.

These steps are merely examples and should not unduly limit the scope of the claims herein. As shown, the above method provides a way of fabricating an integrated electronic device using vertical mounting according to an embodiment of the present invention. One of ordinary skill in the art would recognize many other variations, modifications, and alternatives. For example, various steps outlined above may be added, removed, modified, rearranged, repeated, and/or overlapped, as contemplated within the scope of the invention.

As shown in FIG. 1, method 100 begins at start, step 102. The present method provides a fabrication method for forming an integrated electronic device using vertical mounting. Many benefits are achieved by way of the present invention over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. Preferably, the invention provides for an improved sensors and electronic devices and related methods for a variety of uses. Depending upon the embodiment, one or more of these benefits may be achieved. These and other benefits will be described in more throughout the present specification and more particularly below.

Following step 102, fabrication method 100 involves providing a substrate having a surface region, step 104. In a specific embodiment, the substrate can be a buried oxide (BOX) substrate. In another specific embodiment, the substrate can include an epitaxial (EPI) material. In further embodiments, the substrate can have a silicon, single crystal silicon, or polycrystalline silicon material. Those skilled in the art will recognize other variations, modifications, and alternatives.

In an embodiment, the substrate can have a surface region and a first region can be a region overlying the surface region. At least one sensor or electronic device can be formed on the first region overlying the surface region, step 106. The first region can have a first surface region. In a specific embodiment, the one sensor(s) or electronic device(s) can include transistor devices, metal layers, via structures, and others. The sensor(s) or electronic device(s) can also include a conduction material, a metal material, a metal alloy material, an insulating material, a dielectric material, or other materials or combinations thereof. Additionally, the sensor(s) and electronic device(s) can include integrated CMOS circuit devices, MEMS devices, magnetoresistance devices, or other devices or combinations thereof. The magnetoresistance devices can include anisotropic magnetoresistance (AMR), ordinary magnetoresistance (OMR), giant magnetoresistance (GMR), or tunnel junction magnetoresistance (TMR) devices. In further embodiments, additional transistors, metal layers, and structures can be added. The sensor(s) or electronic device(s) can have one or more contact regions. The contact region(s) can include at least one bond pad, bonding structure, or conductive region, as well as others. The fabrication of the sensor(s) or electronic device(s) can be done through foundry-compatible processes. Of course, there can be other variations, modifications, and alternatives.

Following the formation of sensor(s) or electronic device(s), trench structure(s) can be formed within at least one portion of the first region, step 108. In an embodiment, the trench structure(s) can be formed from a wet etching, dry etching, or mechanical process. In a specific embodiment, the trench structure(s) can be formed from a deep reactive-ion etching (DRIE) process. As stated previously, there can be other variations, modifications, and alternatives.

After the trench structure(s) are formed, a dielectric material can be formed overlying the first region the trench structure(s), the enclosure, and the contact region(s), step 110. In a specific embodiment, the dielectric material can include an insulating material. The insulating material can include a dielectric material, or other material or combination thereof. At least one portion of the dielectric material can also be removed within a vicinity of the contact region(s) of the sensor(s) and electronic device(s) and the trench structure(s), step 112. In a specific embodiment, the removal process of the dielectric material can include a patterning process, or an etching process, or other processes. Again, there can be other variations, modifications, and alternatives.

A conduction material can then be formed overlying the first region the trench structure(s), the enclosure, and the contact region(s), step 114. In a specific embodiment, the conduction material can include a metal material, a metal alloy, other conductive materials or combinations thereof. At least one portion of the conduction material can also be removed within a vicinity of the contact region(s) of the sensor(s) or electronic device(s) and the trench structure(s) to form at least one bonding structure(s), step 116. In a specific embodiment, the removal process of the conduction material can include a patterning process, or an etching process, or other processes. Again, there can be other variations, modifications, and alternatives.

Once the dielectric material and the conduction material have been formed and patterned, the resulting device can be singulated within a vicinity of the bonding structure(s) to form at least one singulated device having at least one vertical bond pad, step 118. In an embodiment, the singulation process can include a dicing, an etching, or a laser scribing process. Of course, there can be other variations, modifications, and alternatives.

The singulated device(s) can be then coupled to a package having a package surface region, step 120. In an embodiment, the singulated device can be configured such that the vertical bond pad(s) are configured horizontally. In a specific embodiment, the singulated device can be rotated 90 degrees and coupled to at least a portion of the package surface region. The package can include wafer level packaging (WLP) materials. The WLP materials can include wafer substrate WLP materials or thin film WLP materials. Once the singulated devices are mounted, at least one interconnection can be formed within a vicinity of the vertical bond pad(s) and at least one portion of the package surface region, step 122. In an embodiment, the interconnections can be formed via a wire bonding process, such as a ball bonding process, a wedge bonding process, or other process and combinations thereof. Those skilled in the art will recognize other variations, modifications, and alternatives.

The above sequence of processes provides a fabrication method for forming sensors or electronic devices using vertical mounting according to an embodiment of the present invention. As shown, the method uses a combination of steps including providing a substrate, forming sensor(s) or electronic device(s), forming a dielectric material, removing at least one portion of the dielectric material, forming a conduction material, removing at least one portion of the conduction material, and singulating the resulting device. Other alternatives can also be provided where steps are added, one or more steps are removed, or one or more steps are provided in a different sequence without departing from the scope of the claims herein. Further details of the present method can be found throughout the present specification.

Figure 2:
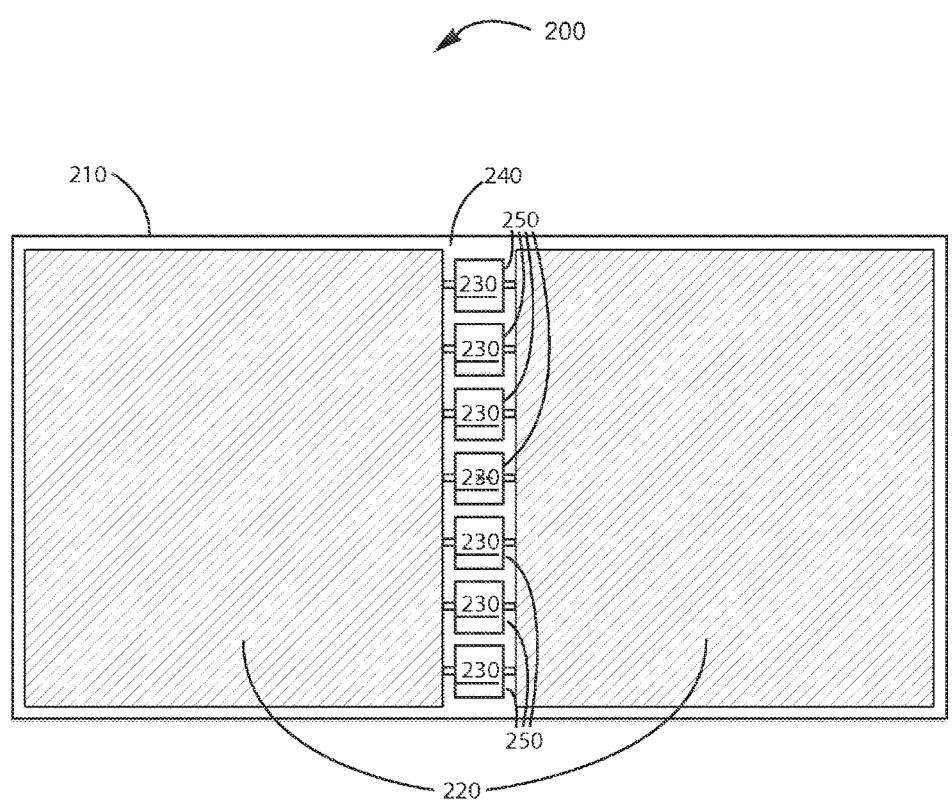
FIG. 2 is a simplified top diagram of a sensor device or electronic device according to an embodiment of the present invention.

FIG. 2 is a simplified top diagram of a sensor device or electronic device according to an embodiment of the present invention. This diagram is merely an example, which should not unduly limit the scope of the claims herein. One of ordinary skill in the art would recognize many other variations, modifications, and alternatives. As shown, device 200 includes a substrate 210, at least one sensor(s) or electronic device(s) 220, trench structure(s) 230, a dielectric layer 240, and a conduction layer 250. Device 200 shown in this figure can represent a sensor device or electronic device prior to singulation, as referred to previously in FIG. 1. Those skilled in the art will recognize other variations, modifications, and alternatives.

In an embodiment, substrate 210 can have a surface region. In a specific embodiment, the substrate can be a buried oxide (BOX) substrate. In another specific embodiment, the substrate can include an epitaxial (EPI) material. In further embodiments, the substrate can have a silicon, single crystal silicon, or polycrystalline silicon material. Those skilled in the art will recognize other variations, modifications, and alternatives.

In an embodiment, at least one sensor or electronic device 220 can be formed on a first region overlying the surface region. The first region can have a first surface region. In a specific embodiment, sensor(s) or electronic device(s) 220 can include transistor devices, metal layers, via structures, and others. Sensor(s) or electronic device(s) 220 can also include a conduction material, a metal material, a metal alloy material, an insulating material, a dielectric material, or other materials or combinations thereof. Additionally, sensor(s) or electronic device(s) 220 can include integrated CMOS circuit devices, MEMS devices, magnetoresistance devices, or other devices or combinations thereof. In specific embodiments, the magnetoresistance devices can include anisotropic magnetoresistance (AMR), ordinary magnetoresistance (OMR), giant magnetoresistance (GMR), tunnel junction magnetoresistance (TMR) devices, or other devices and combinations thereof. In further embodiments, additional transistors, metal layers, and structures can be added. Sensor(s) or electronic device(s) 220 can have at least one contact region. Contact region(s) can include bond pad(s), bonding structure(s), or conductive region(s), as well as others. The fabrication of sensor(s) or electronic device(s) 220 can be done through foundry-compatible processes. Of course, there can be other variations, modifications, and alternatives.

In an embodiment, trench structure(s) 230 can be formed within at least one portion of the first region. In a specific embodiment, trench structure(s) 230 can be formed from a wet etching, dry etching, or mechanical process. Also, trench structure(s) 230 can be formed from a deep reactive-ion etching (DRIE) process. The trench structures formed from the DRIE process can have trench sidewalls with slopes that are greater than 90 degrees. As stated previously, there can be other variations, modifications, and alternatives.

Device 200 can also have an enclosure formed to house one or more sensor(s) or electronic device(s) 220. The enclosure can include a silicon material, an insulating material, or other material or combination thereof. In an embodiment, dielectric material 240 can be formed overlying the first region trench structure(s) 230, and the contact region(s). At least one portion of dielectric material 240 can also be removed within a vicinity of the contact region(s) of sensor(s) or electronic device(s) 220 and trench structure(s) 230. In a specific embodiment, the removal process of dielectric material 240 can include a patterning process, or an etching process, or other processes. Again, there can be other variations, modifications, and alternatives.

In an embodiment, conduction material 250 can include a metal material, a metal alloy, other conductive materials or combinations thereof. At least one portion of conduction material 250 can also be removed within a vicinity of one or more of the contact regions of sensor(s) or electronic device(s) 220 and trench structure(s) 230 to form at least one bonding structure. In a specific embodiment, the removal process of conduction material 250 can include a patterning process, or an etching process, or other processes. Again, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 3:
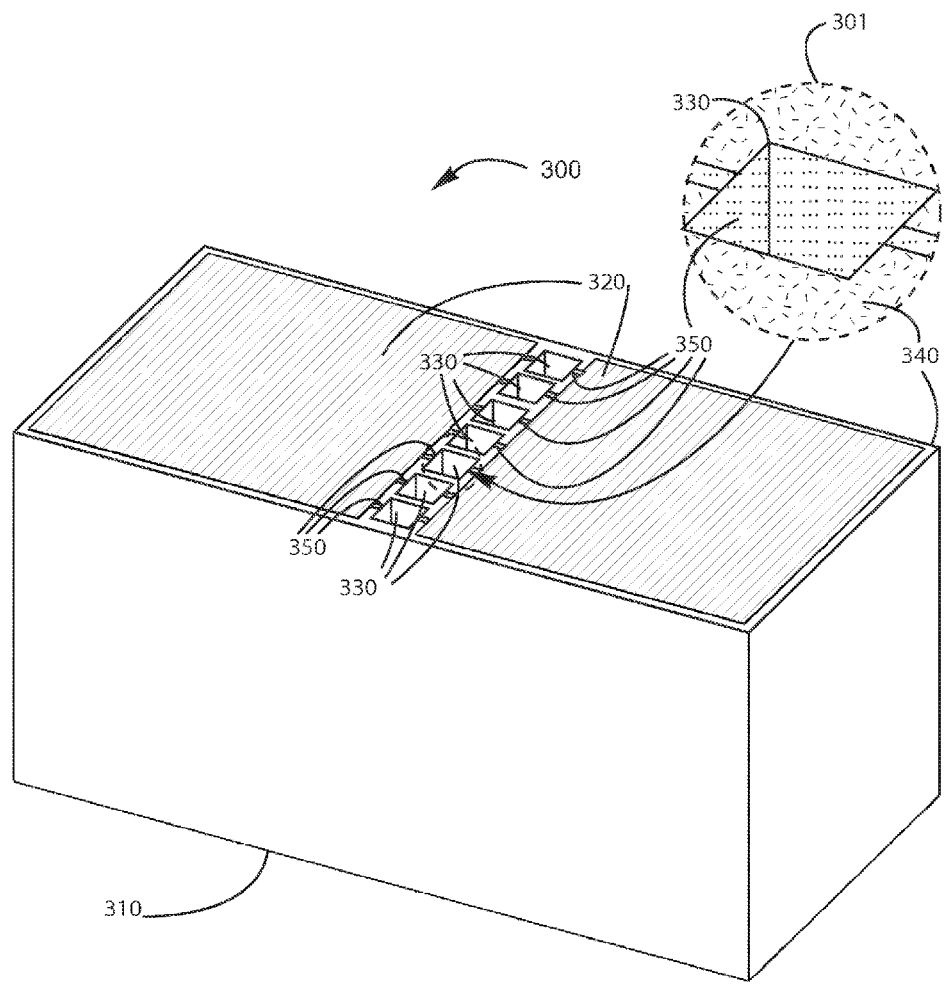
FIG. 3 is a simplified perspective diagram of a sensor device or electronic device according to an embodiment of the present invention.

FIG. 3 is a simplified perspective diagram of a sensor device or electronic device according to an embodiment of the present invention. This diagram is merely an example, which should not unduly limit the scope of the claims herein. One of ordinary skill in the art would recognize many other variations, modifications, and alternatives. As shown, device 300 includes a substrate 310, at least one sensor or electronic device 320, at least one trench structure(s) 330, a dielectric layer 340, and a conduction layer 350. Device 300 shown in this figure can represent a sensor device or electronic device prior to singulation, as referred to previously in FIG. 1. Features of this embodiment are more clearly shown in close-up 301. Those skilled in the art will recognize other variations, modifications, and alternatives.

In an embodiment, substrate 310 can have a surface region. In a specific embodiment, the substrate can be a buried oxide (BOX) substrate. In another specific embodiment, the substrate can include an epitaxial (EPI) material. In further embodiments, the substrate can have a silicon, single crystal silicon, or polycrystalline silicon material. Those skilled in the art will recognize other variations, modifications, and alternatives.

In an embodiment, at least one sensor or electronic device 320 can be formed on a first region overlying the surface region. The first region can have a first surface region. In a specific embodiment, sensor(s) or electronic device(s) 320 can include transistor devices, metal layers, via structures, and others. Sensor(s) or electronic device(s) 320 can also include a conduction material, a metal material, a metal alloy material, an insulating material, a dielectric material, or other materials or combinations thereof. Additionally, sensor(s) or electronic device(s) 320 can include integrated CMOS circuit devices, MEMS devices, magnetoresistance devices, or other devices or combinations thereof. In specific embodiments, the magnetoresistance devices can include anisotropic magnetoresistance (AMR), ordinary magnetoresistance (OMR), giant magnetoresistance (GMR), tunnel junction magnetoresistance (TMR), or other devices and combinations thereof. In further embodiments, additional transistors, metal layers, and structures can be added. Sensor(s) or electronic device(s) 320 can have one or more contact regions. Contact region(s) can include bond pad(s), bonding structure(s), or conductive region(s), as well as others. The fabrication of sensor(s) or electronic device(s) 320 can be done through foundry-compatible processes. Of course, there can be other variations, modifications, and alternatives.

In an embodiment, trench structure(s) 330 can be formed within at least one portion of the first region. In a specific embodiment, trench structure(s) 330 can be formed from a wet etching, dry etching, or mechanical process. Also, trench structure(s) 330 can be formed from a deep reactive-ion etching (DRIE) process. The trench structures formed from the DRIE process can have trench sidewalls with slopes that are greater than 90 degrees. As stated previously, there can be other variations, modifications, and alternatives.

Device 300 can also have an enclosure formed to house the sensor(s) or electronic device(s) 320. The enclosure can include a silicon material, an insulating material, or other material or combination thereof. In an embodiment, dielectric material 340 can be formed overlying the first region trench structure(s) 330 and of the contact region(s). At least one portion of dielectric material 340 can also be removed within a vicinity of the contact region(s) of sensor(s) or electronic device(s) 320 and trench structure(s) 330. In a specific embodiment, the removal process of dielectric material 340 can include a patterning process, or an etching process, or other processes. Again, there can be other variations, modifications, and alternatives.

In an embodiment, conduction material 350 can include a metal material, a metal alloy, other conductive materials or combinations thereof. At least one portion of conduction material 350 can also be removed within a vicinity of the contact region(s) of sensor(s) or electronic device(s) 320 and trench structure(s) 330 to form at least one bonding structure. In a specific embodiment, the removal process of conduction material 350 can include a patterning process, or an etching process, or other processes. Again, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 4:
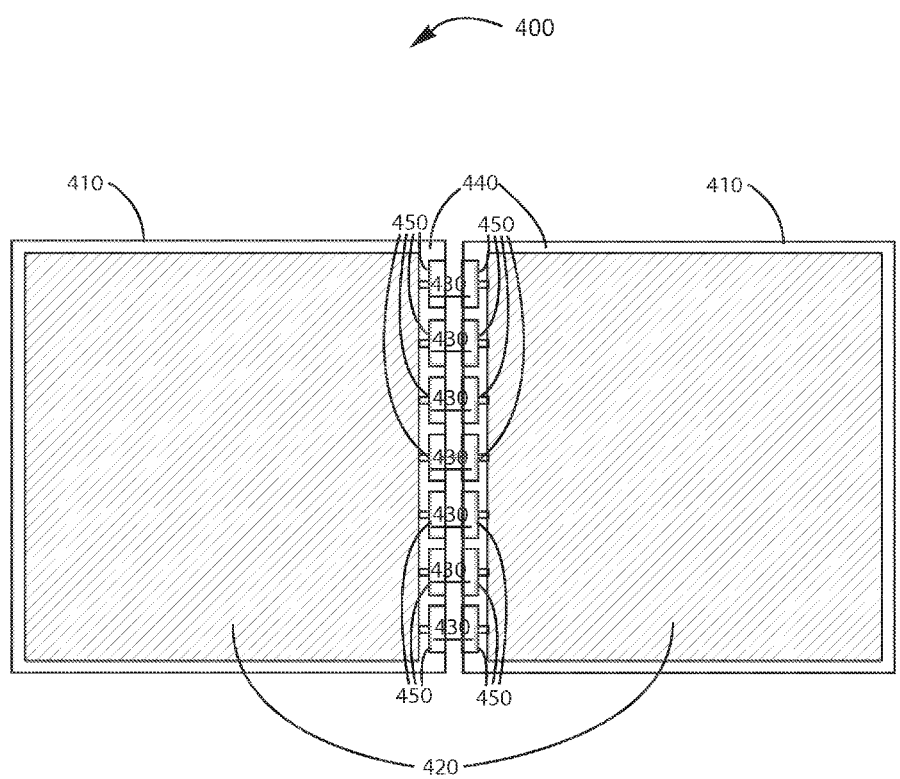
FIG. 4 is a simplified top diagram of a sensor device or electronic device according to an embodiment of the present invention.

FIG. 4 is a simplified top diagram of a sensor device or electronic device according to an embodiment of the present invention. This diagram is merely an example, which should not unduly limit the scope of the claims herein. One of ordinary skill in the art would recognize many other variations, modifications, and alternatives. As shown, device 400 includes a substrate 410, at least one sensor or electronic device 420, at least one trench structure 430, a dielectric layer 440, a conduction layer 450, and at least one vertical bond pad. Device 400 shown in this figure can represent an integrated electronic device following singulation, as referred to previously in FIG. 1. Those skilled in the art will recognize other variations, modifications, and alternatives.

In an embodiment, substrate 410 can have a surface region. In a specific embodiment, the substrate can be a buried oxide (BOX) substrate. In another specific embodiment, the substrate can include an epitaxial (EPI) material. In further embodiments, the substrate can have a silicon, single crystal silicon, or polycrystalline silicon material. Those skilled in the art will recognize other variations, modifications, and alternatives.

In an embodiment, sensor(s) or electronic device(s) 420 can be formed on a first region overlying the surface region. The first region can have a first surface region. In a specific embodiment, sensor(s) or electronic device(s) 420 can include transistor devices, metal layers, via structures, and others. Sensor(s) or electronic device(s) 420 can also include a conduction material, a metal material, a metal alloy material, an insulating material, a dielectric material, or other materials or combinations thereof. Additionally, sensor(s) or electronic device(s) 420 can include integrated CMOS circuit devices, MEMS devices, magnetoresistance devices, or other devices or combinations thereof. In specific embodiments, the magnetoresistance devices can include anisotropic magnetoresistance (AMR), ordinary magnetoresistance (OMR), giant magnetoresistance (GMR), tunnel junction magnetoresistance (TMR), or other devices and combinations thereof. In further embodiments, additional transistors, metal layers, and structures can be added. Sensor(s) or electronic device(s) 420 can have at least one contact region. The contact region(s) can include bond pad(s), bonding structure(s), or conductive region(s), as well as others. The fabrication of sensor(s) or electronic device(s) 420 can be done through foundry-compatible processes. Of course, there can be other variations, modifications, and alternatives.

In an embodiment, trench structure(s) 430 can be formed within at least a portion of the first region. In a specific embodiment, trench structure(s) 430 can be formed from a wet etching, dry etching, or mechanical process. Also, trench structure(s) 430 can be formed from a deep reactive-ion etching (DRIE) process. The trench structures formed from the DRIE process can have trench sidewalls with slopes that are greater than 90 degrees. As stated previously, there can be other variations, modifications, and alternatives.

Device 400 can also have an enclosure formed to house the sensor(s) or electronic device(s) 420. The enclosure can include a silicon material, an insulating material, or other material or combination thereof. In an embodiment, dielectric material 440 can be formed overlying the first region, trench structure(s) 430, and the contact region(s). In a specific embodiment, dielectric material 440 can include an insulating material. The insulating material can include a dielectric material, or other material or combination thereof. At least one portion of dielectric material 440 can also be removed within a vicinity of the contact region(s) of sensor(s) or electronic device(s) 420 and trench structure(s) 430. In a specific embodiment, the removal process of dielectric material 440 can include a patterning process, or an etching process, or other processes. Again, there can be other variations, modifications, and alternatives.

In an embodiment, conduction material 450 can include a metal material, a metal alloy, other conductive materials or combinations thereof. At least one portion of conduction material 450 can also be removed within a vicinity of the contact region(s) of sensor(s) or electronic device(s) 420 and trench structure(s) 430 to form at least one bonding structure. In a specific embodiment, the removal process of conduction material 450 can include a patterning process, or an etching process, or other processes. Again, there can be other variations, modifications, and alternatives.

In an embodiment, the vertical bond pad(s) can be operably coupled to the conduction material 450 and the dielectric material 440. In a specific embodiment, the vertical bond pad(s) can be formed by a singulation process within a vicinity of the bonding structure(s). In an embodiment, the singulation process can include a dicing, an etching, or a laser scribing process. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 5:
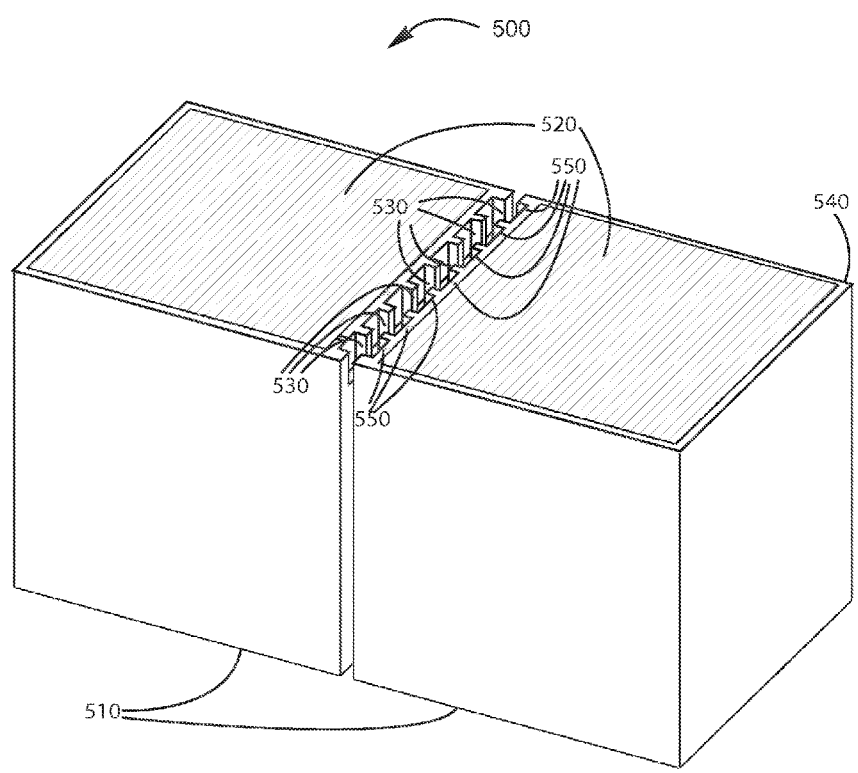
FIG. 5 is a simplified perspective diagram of a sensor device or electronic device according to an embodiment of the present invention.

FIG. 5 is a simplified perspective diagram of a sensor device or electronic device according to an embodiment of the present invention. This diagram is merely an example, which should not unduly limit the scope of the claims herein. One of ordinary skill in the art would recognize many other variations, modifications, and alternatives. As shown, device 500 includes a substrate 510, at least one sensor or electronic device 520, at least one trench structure 530, a dielectric layer 540, a conduction layer 550, and at least one vertical bond pad. Device 500 shown in this figure can represent an integrated electronic device following singulation, as referred to previously in FIG. 1. Those skilled in the art will recognize other variations, modifications, and alternatives.

In an embodiment, substrate 510 can have a surface region. In a specific embodiment, the substrate can be a buried oxide (BOX) substrate. In another specific embodiment, the substrate can include an epitaxial (EPI) material. In further embodiments, the substrate can have a silicon, single crystal silicon, or polycrystalline silicon material. Those skilled in the art will recognize other variations, modifications, and alternatives.

In an embodiment, sensor(s) or electronic device(s) 520 can be formed on a first region overlying the surface region. The first region can have a first surface region. In a specific embodiment, sensor(s) or electronic device(s) 520 can include transistor devices, metal layers, via structures, and others. Sensor(s) or electronic device(s) 520 can also include a conduction material, a metal material, a metal alloy material, an insulating material, a dielectric material, or other materials or combinations thereof. Additionally, sensor(s) or electronic device(s) 520 can include integrated CMOS circuit devices, MEMS devices, magnetoresistance devices, or other devices or combinations thereof. In specific embodiments, the magnetoresistance devices can include anisotropic magnetoresistance (AMR), ordinary magnetoresistance (OMR), giant magnetoresistance (GMR), tunnel junction magnetoresistance (TMR), or other devices or combinations thereof. In further embodiments, additional transistors, metal layers, and structures can be added. Sensor(s) or electronic device(s) 520 can have at least one contact region. The contact region(s) can include bond pad(s), bonding structure(s), or conductive region(s), as well as others. The fabrication of sensor(s) or electronic device(s) 520 can be done through foundry-compatible processes. Of course, there can be other variations, modifications, and alternatives.

In an embodiment, trench structure(s) 530 can be formed within at least one portion of the first region. In a specific embodiment, trench structure(s) 530 can be formed from a wet etching, dry etching, or mechanical process. Also, trench structure(s) 530 can be formed from a deep reactive-ion etching (DRIE) process. The trench structures formed from the DRIE process can have trench sidewalls with slopes that are greater than 90 degrees. As stated previously, there can be other variations, modifications, and alternatives.

Device 500 can also have an enclosure formed to house sensor(s) or electronic device(s) 520. The enclosure can include a silicon material, an insulating material, or other material or combination thereof. In an embodiment, dielectric material 540 can be formed overlying the first region, trench structure(s) 530, and the contact region(s). At least one portion of dielectric material 540 can also be removed within a vicinity of the contact region(s) of sensor(s) or electronic device(s) 520 and trench structure(s) 530. In a specific embodiment, the removal process of dielectric material 540 can include a patterning process, or an etching process, or other processes. Again, there can be other variations, modifications, and alternatives.

In an embodiment, conduction material 550 can include a metal material, a metal alloy, other conductive materials or combinations thereof. At least one portion of conduction material 550 can also be removed within a vicinity of the contact region(s) of sensor(s) or electronic device(s) 520 and trench structure(s) 530 to form at least one bonding structure. In a specific embodiment, the removal process of conduction material 550 can include a patterning process, or an etching process, or other processes. Again, there can be other variations, modifications, and alternatives.

In an embodiment, the vertical bond pad(s) can be operably coupled to the conduction material 550 and the dielectric material 540. In a specific embodiment, the vertical bond pad(s) can be formed by a singulation process within a vicinity of the bonding structure(s). In an embodiment, the singulation process can include a dicing, an etching, or a laser scribing process. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 6:
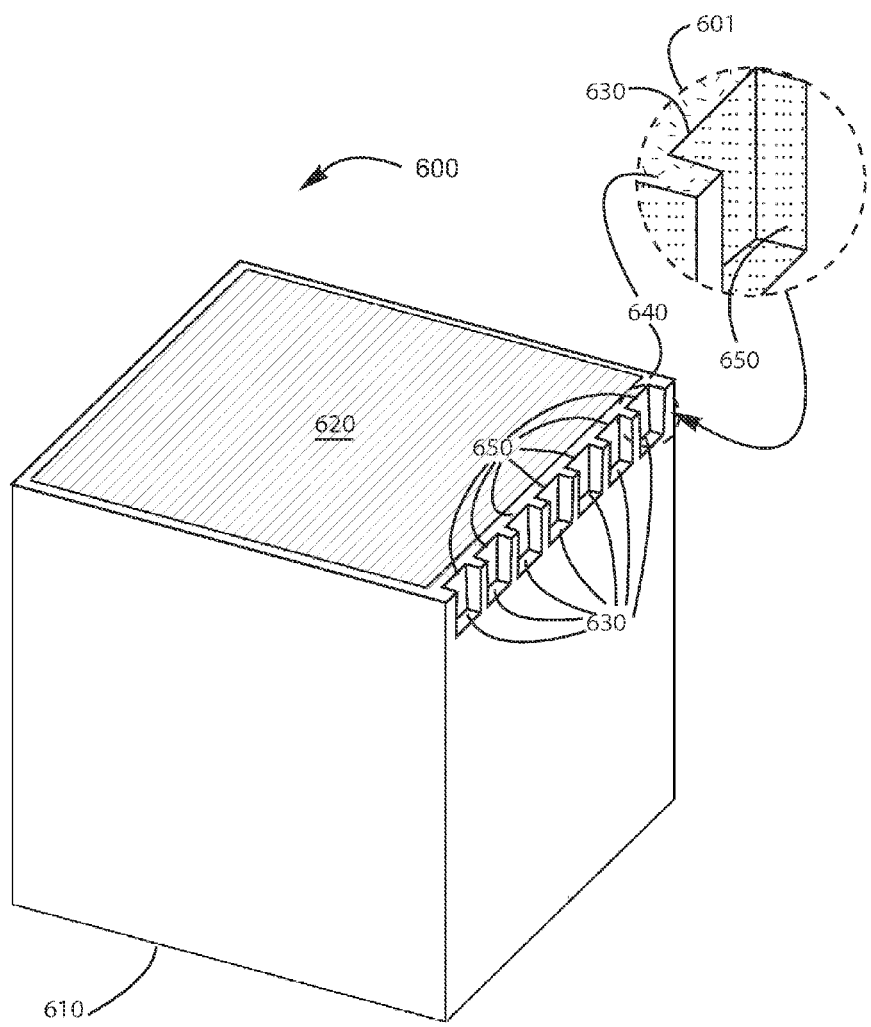
FIG. 6 is a simplified perspective diagram of a sensor device or electronic device according to an embodiment of the present invention.

FIG. 6 is a simplified perspective diagram of a sensor device or electronic device according to an embodiment of the present invention. This diagram is merely an example, which should not unduly limit the scope of the claims herein. One of ordinary skill in the art would recognize many other variations, modifications, and alternatives. As shown, device 600 includes a substrate 610, at least one sensor or electronic device 620, at least one trench structures 630, a dielectric layer 640, a conduction layer 650, and at least one vertical bond pad. Features of this embodiment are more clearly shown in close-up 601. Those skilled in the art will recognize other variations, modifications, and alternatives.

In an embodiment, substrate 610 can have a surface region. In a specific embodiment, the substrate can be a buried oxide (BOX) substrate. In another specific embodiment, the substrate can include an epitaxial (EPI) material. In further embodiments, the substrate can have a silicon, single crystal silicon, or polycrystalline silicon material. Those skilled in the art will recognize other variations, modifications, and alternatives.

In an embodiment, sensor(s) or electronic device(s) 620 can be formed on a first region overlying the surface region. The first region can have a first surface region. In a specific embodiment, sensor(s) or electronic device(s) 620 can include transistor devices, metal layers, via structures, and others. Sensor(s) or electronic device(s) 620 can also include a conduction material, a metal material, a metal alloy material, an insulating material, a dielectric material, or other materials or combinations thereof. Additionally, sensor(s) or electronic device(s) 620 can include integrated CMOS circuit devices, MEMS devices, magnetoresistance devices, or other devices or combinations thereof. In specific embodiments, the magnetoresistance devices can include anisotropic magnetoresistance (AMR), ordinary magnetoresistance (OMR), giant magnetoresistance (GMR), tunnel junction magnetoresistance (TMR), or other devices or combinations thereof. In further embodiments, additional transistors, metal layers, and structures can be added. Sensor(s) or electronic device(s) 620 can have at least one contact region. The contact region(s) can include bond pad(s), bonding structure(s), or conductive region(s), as well as others. The fabrication of sensor(s) or electronic device(s) 620 can be done through foundry-compatible processes. Of course, there can be other variations, modifications, and alternatives.

In an embodiment, trench structure(s) 630 can be formed within at least one portion of the first region. In a specific embodiment, trench structure(s) 630 can be formed from a wet etching, dry etching, or mechanical process. Also, trench structure(s) 630 can be formed from a deep reactive-ion etching (DRIE) process. The trench structures formed from the DRIE process can have trench sidewalls with slopes that are greater than 90 degrees. As stated previously, there can be other variations, modifications, and alternatives.

Device 600 can also have an enclosure formed to house sensor(s) or electronic device(s) 620. The enclosure can include a silicon material, an insulating material, or other material or combination thereof. In an embodiment, dielectric material 640 can be formed overlying the first region one or more trench structures 630, the enclosure, and one or more of the contact regions. At least one portion of dielectric material 640 can also be removed within a vicinity of the contact region(s) of sensor(s) or electronic device(s) 620 and trench structure(s) 630. In a specific embodiment, the removal process of dielectric material 640 can include a patterning process, or an etching process, or other processes. Again, there can be other variations, modifications, and alternatives.

In an embodiment, conduction material 650 can include a metal material, a metal alloy, other conductive materials or combinations thereof. At least one portion of conduction material 650 can also be removed within a vicinity of the contact region(s) of sensor(s) or electronic device(s) 620 and trench structure(s) 630 to form at least one bonding structure. In a specific embodiment, the removal process of conduction material 650 can include a patterning process, or an etching process, or other processes. Again, there can be other variations, modifications, and alternatives.

In an embodiment, the vertical bond pads can be operably coupled to the conduction material 650 and the dielectric material 640. In a specific embodiment, the vertical bond pad can be formed by a singulation process within a vicinity of the bonding structure(s). In an embodiment, the singulation process can include a dicing, an etching, or a laser scribing process. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 7:
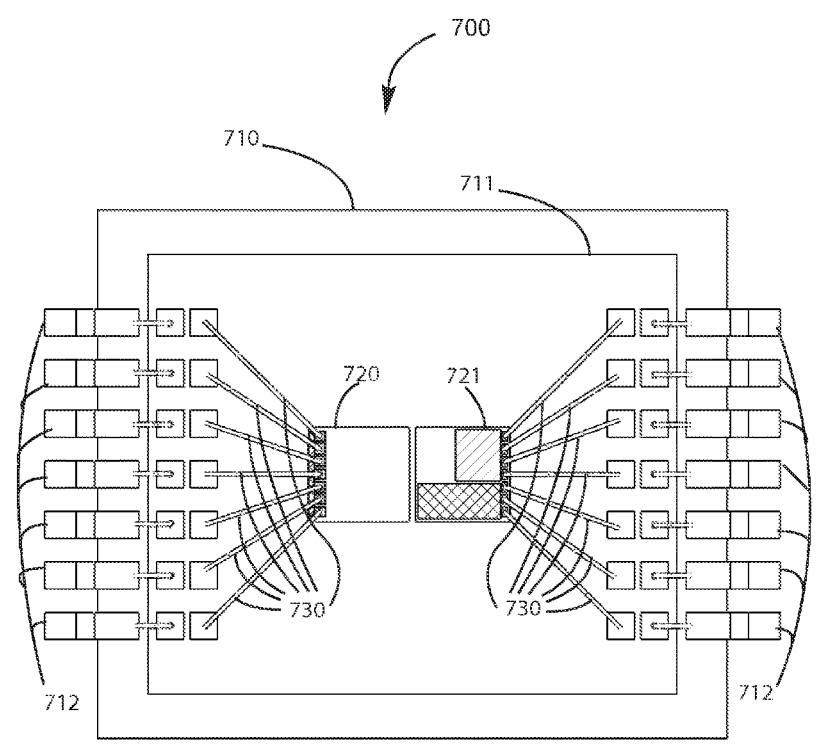
FIG. 7 is a simplified top diagram of a sensor device or electronic device according to an embodiment of the present invention.

FIG. 7 is a simplified top diagram of a sensor device or electronic device according to an embodiment of the present invention. This diagram is merely an example, which should not unduly limit the scope of the claims herein. One of ordinary skill in the art would recognize many other variations, modifications, and alternatives. As shown, device 700 includes a package 710, at least one singulated device having vertical bond pad(s) 720, and at last one interconnection 730. In an embodiment, FIG. 7 can represent device after the coupling process between the package and the singulated device(s). Those skilled in the art will recognize other variations, modifications, and alternatives.

In an embodiment, package 710 can have a package surface region. In a specific embodiment, the package can be a substrate package or a lead frame package. The package can have at least one interconnection leg 712 and/or an application specific integrated circuit (ASIC) material 711 disposed overlying at least one portion of the package surface region. In further embodiments, the substrate can have a silicon, single crystal silicon, or polycrystalline silicon material. Those skilled in the art will recognize other variations, modifications, and alternatives.

In an embodiment, singulated device(s) 720 can be couple to at least one portion of the package surface region. In a specific embodiment, the singulated device(s) 720 can be coupled such that the vertical bond pad(s) of the singulated device(s) 720 are configured horizontally. The singulated device(s) 720 can be rotated 90 degrees and mounted on package 710. The singulated device can also be configured in other orientations while being mounted on package 710. In a specific embodiment, at least one sensor or electronic device having bond pad(s) 721 can be coupled to at least a portion of the package surface region. Of course, there can be other variations, modifications, and alternatives.

In an embodiment, interconnections 730 can be formed within a vicinity of the vertical bond pad(s) or bond pad(s) and at least one portion of the package surface region. In a specific embodiment, interconnections 730 can be formed within a vicinity of the bond pads and at least one portion of the ASIC material 711. In a specific embodiment, interconnections 730 can be formed via a wire bonding process, which can include ball bonding, wedge bonding, and other bonding processes. Those of ordinary skill in the art will recognize other variations, modifications, and alternatives.

In an embodiment, an enclosure can be formed overlying devices 720 and 721, interconnections 730, and package 710. The enclosure can include a wafer level packaging (WLP) material. In a specific embodiment, the WLP materials can include a wafer substrate WLP material, a thin film WLP material, or other materials and combinations thereof. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 8:
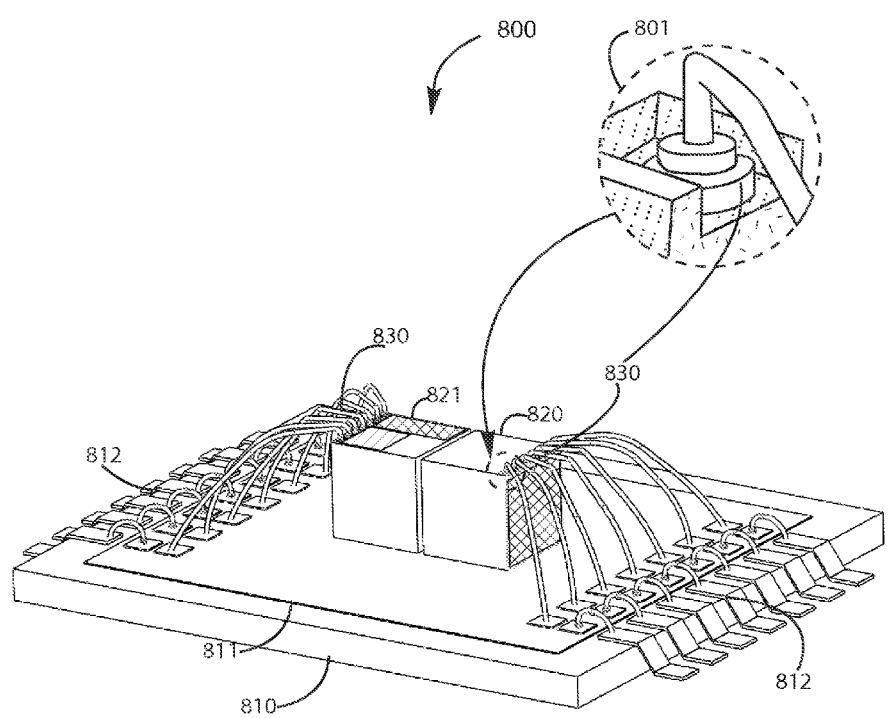
FIG. 8 is a simplified perspective diagram of a sensor device or electronic device according to an embodiment of the present invention.

FIG. 8 is a simplified perspective diagram of a sensor device or electronic device according to an embodiment of the present invention. This diagram is merely an example, which should not unduly limit the scope of the claims herein. One of ordinary skill in the art would recognize many other variations, modifications, and alternatives. As shown, device 800 includes a package 810, at least one singulated device having vertical bond pad(s) 820, and at last one interconnection 830. In an embodiment, FIG. 8 can represent device after the coupling process between the package and the singulated device(s). Features of this embodiment are more clearly shown in close-up 801. Those skilled in the art will recognize other variations, modifications, and alternatives.

In an embodiment, package 810 can have a package surface region. In a specific embodiment, the package can be a substrate package or a lead frame package. The package can have at least one interconnection leg 812 and/or an application specific integrated circuit (ASIC) material 811 disposed overlying at least one portion of the package surface region. In further embodiments, the substrate can have a silicon, single crystal silicon, or polycrystalline silicon material. Those skilled in the art will recognize other variations, modifications, and alternatives.

In an embodiment, singulated device(s) 820 can be couple to at least one portion of the package surface region. In a specific embodiment, the singulated device(s) 820 can be coupled such that the vertical bond pad(s) of the singulated device(s) 820 are configured horizontally. The singulated device(s) 820 can be rotated 90 degrees and mounted on package 810. The singulated device can also be configured in other orientations while being mounted on package 810. In a specific embodiment, at least one sensor or electronic device having bond pad(s) 821 can be coupled to at least a portion of the package surface region. Of course, there can be other variations, modifications, and alternatives.

In an embodiment, interconnections 830 can be formed within a vicinity of the vertical bond pad(s) or bond pad(s) and at least one portion of the package surface region. In a specific embodiment, interconnections 830 can be formed within a vicinity of the bond pads and at least one portion of the ASIC material 811. In a specific embodiment, interconnections 830 can be formed via a wire bonding process, which can include ball bonding, wedge bonding, and other bonding processes. Those of ordinary skill in the art will recognize other variations, modifications, and alternatives.

In an embodiment, an enclosure can be formed overlying devices 820 and 821, interconnections 830, and package 810. The enclosure can include a wafer level packaging (WLP) material. In a specific embodiment, the WLP materials can include a wafer substrate WLP material, a thin film WLP material, or other materials and combinations thereof. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 9:
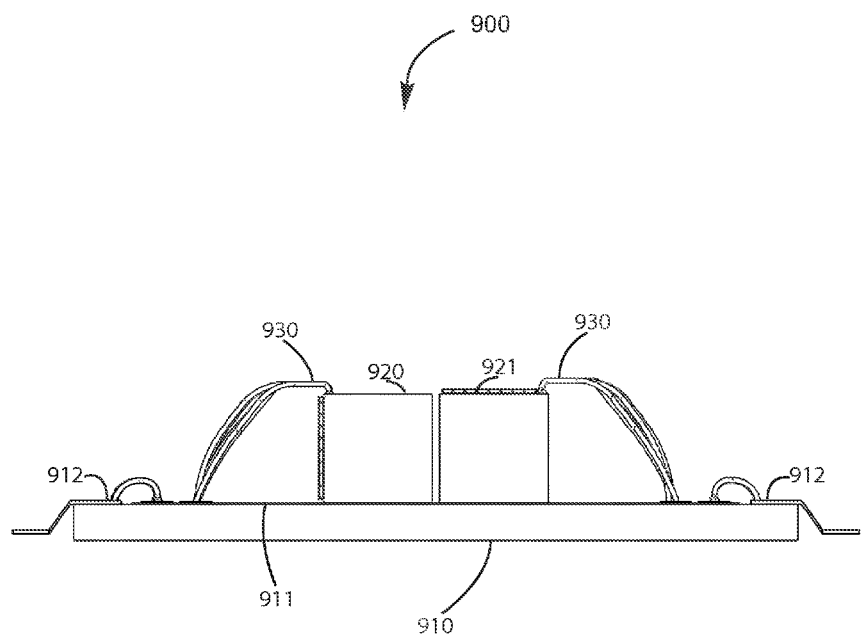
FIG. 9 is a simplified side diagram of a sensor device or electronic device according to an embodiment of the present invention.

FIG. 9 is a simplified side diagram of a sensor device or electronic device according to an embodiment of the present invention. This diagram is merely an example, which should not unduly limit the scope of the claims herein. One of ordinary skill in the art would recognize many other variations, modifications, and alternatives. As shown, device 900 includes a package 910, at least one singulated device having vertical bond pad(s) 920, and at last one interconnection 930. In an embodiment, FIG. 9 can represent device after the coupling process between the package and the singulated device(s). Those skilled in the art will recognize other variations, modifications, and alternatives.

In an embodiment, package 910 can have a package surface region. In a specific embodiment, the package can be a substrate package or a lead frame package. The package can have at least one interconnection leg 912 and/or an application specific integrated circuit (ASIC) material 911 disposed overlying at least one portion of the package surface region. In further embodiments, the substrate can have a silicon, single crystal silicon, or polycrystalline silicon material. Those skilled in the art will recognize other variations, modifications, and alternatives.

In an embodiment, singulated device(s) 920 can be couple to at least one portion of the package surface region. In a specific embodiment, the singulated device(s) 920 can be coupled such that the vertical bond pad(s) of the singulated device(s) 920 are configured horizontally. The singulated device(s) 920 can be rotated 90 degrees and mounted on package 910. The singulated device can also be configured in other orientations while being mounted on package 910. In a specific embodiment, at least one sensor or electronic device having bond pad(s) 921 can be coupled to at least a portion of the package surface region. Of course, there can be other variations, modifications, and alternatives.

In an embodiment, interconnections 930 can be formed within a vicinity of the vertical bond pad(s) or bond pad(s) and at least one portion of the package surface region. In a specific embodiment, interconnections 930 can be formed within a vicinity of the bond pads and at least one portion of the ASIC material 911. In a specific embodiment, interconnections 930 can be formed via a wire bonding process, which can include ball bonding, wedge bonding, and other bonding processes. Those of ordinary skill in the art will recognize other variations, modifications, and alternatives.

In an embodiment, an enclosure can be formed overlying devices 920 and 921, interconnections 930, and package 910. The enclosure can include a wafer level packaging (WLP) material. In a specific embodiment, the WLP materials can include a wafer substrate WLP material, a thin film WLP material, or other materials and combinations thereof. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 10:
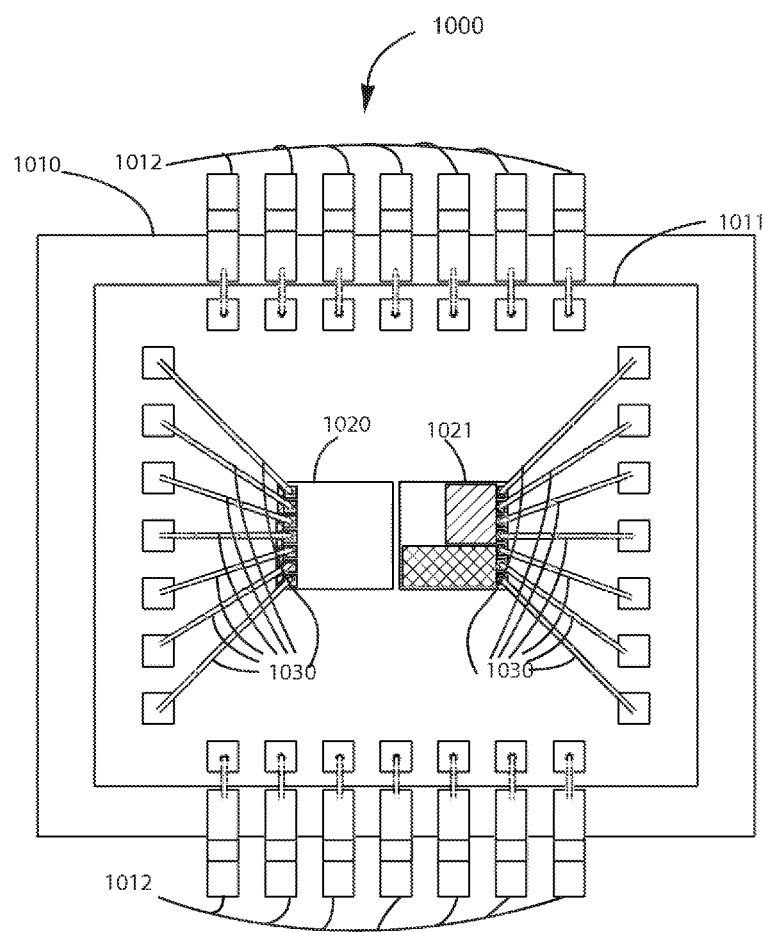
FIG. 10 is a simplified top diagram of a sensor device or electronic device according to an embodiment of the present invention.

FIG. 10 is a simplified top diagram of a sensor device or electronic device according to an embodiment of the present invention. This diagram is merely an example, which should not unduly limit the scope of the claims herein. One of ordinary skill in the art would recognize many other variations, modifications, and alternatives. As shown, device 1000 includes a package 1010, at least one singulated device having vertical bond pad(s) 1020, and at last one interconnection 1030. In an embodiment, FIG. 10 can represent device after the coupling process between the package and the singulated device(s). Those skilled in the art will recognize other variations, modifications, and alternatives.

In an embodiment, package 1010 can have a package surface region. In a specific embodiment, the package can be a substrate package or a lead frame package. The package can have at least one interconnection leg 1012 and/or an application specific integrated circuit (ASIC) material 1011 disposed overlying at least one portion of the package surface region. In further embodiments, the substrate can have a silicon, single crystal silicon, or polycrystalline silicon material. Those skilled in the art will recognize other variations, modifications, and alternatives.

In an embodiment, singulated device(s) 1020 can be couple to at least one portion of the package surface region. In a specific embodiment, the singulated device(s) 1020 can be coupled such that the vertical bond pad(s) of the singulated device(s) 1020 are configured horizontally. The singulated device(s) 1020 can be rotated 90 degrees and mounted on package 1010. The singulated device can also be configured in other orientations while being mounted on package 1010. In a specific embodiment, at least one sensor or electronic device having bond pad(s) 1021 can be coupled to at least a portion of the package surface region. Of course, there can be other variations, modifications, and alternatives.

In an embodiment, interconnections 1030 can be formed within a vicinity of the vertical bond pad(s) or bond pad(s) and at least one portion of the package surface region. In a specific embodiment, interconnections 1030 can be formed within a vicinity of the bond pads and at least one portion of the ASIC material 1011. In a specific embodiment, interconnections 1030 can be formed via a wire bonding process, which can include ball bonding, wedge bonding, and other bonding processes. Those of ordinary skill in the art will recognize other variations, modifications, and alternatives.

In an embodiment, an enclosure can be formed overlying devices 1020 and 1021, interconnections 1030, and package 1010. The enclosure can include a wafer level packaging (WLP) material. In a specific embodiment, the WLP materials can include a wafer substrate WLP material, a thin film WLP material, or other materials and combinations thereof. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 11:
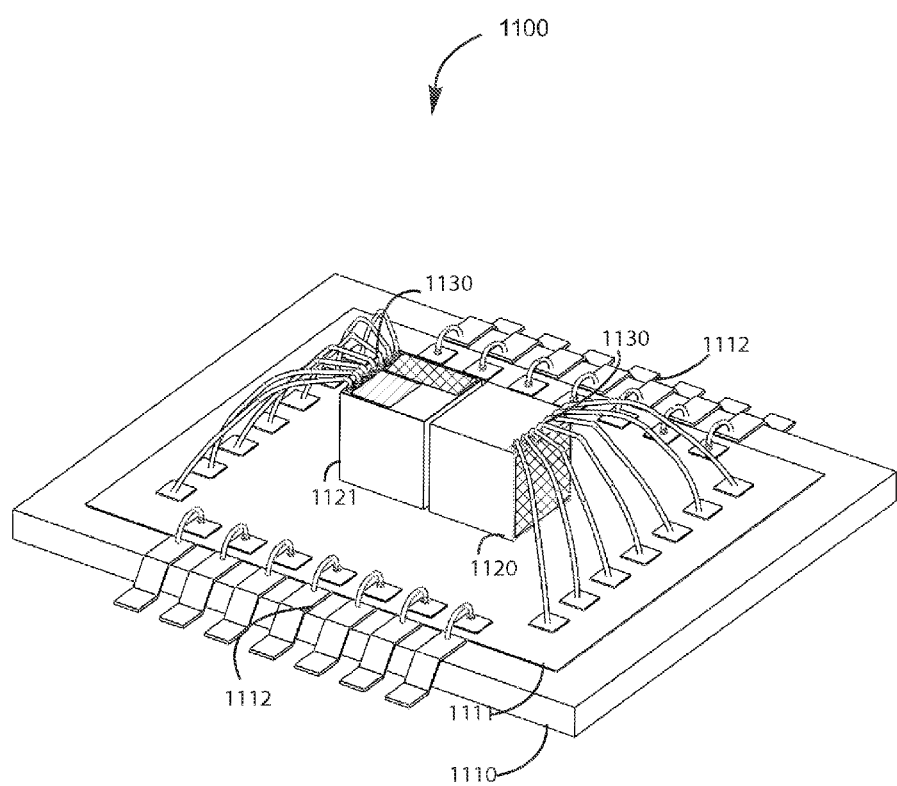
FIG. 11 is a simplified perspective diagram of a sensor device or electronic device according to an embodiment of the present invention.

FIG. 11 is a simplified perspective diagram of a sensor device or electronic device according to an embodiment of the present invention. This diagram is merely an example, which should not unduly limit the scope of the claims herein. One of ordinary skill in the art would recognize many other variations, modifications, and alternatives. As shown, device 1100 includes a package 1110, at least one singulated device having vertical bond pad(s) 1120, and at last one interconnection 1130. In an embodiment, FIG. 11 can represent device after the coupling process between the package and the singulated device(s). Those skilled in the art will recognize other variations, modifications, and alternatives.

In an embodiment, package 1110 can have a package surface region. In a specific embodiment, the package can be a substrate package or a lead frame package. The package can have at least one interconnection leg 1112 and/or an application specific integrated circuit (ASIC) material 1111 disposed overlying at least one portion of the package surface region. In further embodiments, the substrate can have a silicon, single crystal silicon, or polycrystalline silicon material. Those skilled in the art will recognize other variations, modifications, and alternatives.

In an embodiment, singulated device(s) 1120 can be couple to at least one portion of the package surface region. In a specific embodiment, the singulated device(s) 1120 can be coupled such that the vertical bond pad(s) of the singulated device(s) 1120 are configured horizontally. The singulated device(s) 1120 can be rotated 90 degrees and mounted on package 1110. The singulated device can also be configured in other orientations while being mounted on package 1110. In a specific embodiment, at least one sensor or electronic device having bond pad(s) 1121 can be coupled to at least a portion of the package surface region. Of course, there can be other variations, modifications, and alternatives.

In an embodiment, interconnections 1130 can be formed within a vicinity of the vertical bond pad(s) or bond pad(s) and at least one portion of the package surface region. In a specific embodiment, interconnections 1130 can be formed within a vicinity of the bond pads and at least one portion of the ASIC material 1111. In a specific embodiment, interconnections 1130 can be formed via a wire bonding process, which can include ball bonding, wedge bonding, and other bonding processes. Those of ordinary skill in the art will recognize other variations, modifications, and alternatives.

In an embodiment, an enclosure can be formed overlying devices 1120 and 1121, interconnections 1130, and package 1110. The enclosure can include a wafer level packaging (WLP) material. In a specific embodiment, the WLP materials can include a wafer substrate WLP material, a thin film WLP material, or other materials and combinations thereof. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 12:
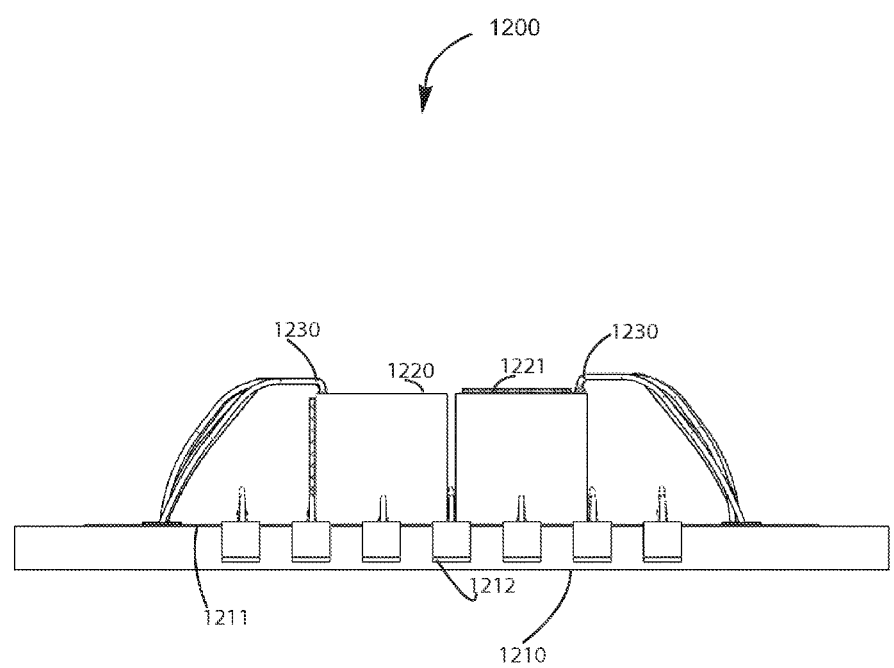
FIG. 12 is a simplified side diagram of a sensor device or electronic device according to an embodiment of the present invention.

FIG. 12 is a simplified side diagram of a sensor device or electronic device according to an embodiment of the present invention. This diagram is merely an example, which should not unduly limit the scope of the claims herein. One of ordinary skill in the art would recognize many other variations, modifications, and alternatives. As shown, device 1200 includes a package 1210, at least one singulated device having vertical bond pad(s) 1220, and at last one interconnection 1230. In an embodiment, FIG. 12 can represent device after the coupling process between the package and the singulated device(s). Those skilled in the art will recognize other variations, modifications, and alternatives.

In an embodiment, package 1210 can have a package surface region. In a specific embodiment, the package can be a substrate package or a lead frame package. The package can have at least one interconnection leg 1212 and/or an application specific integrated circuit (ASIC) material 1211 disposed overlying at least one portion of the package surface region. In further embodiments, the substrate can have a silicon, single crystal silicon, or polycrystalline silicon material. Those skilled in the art will recognize other variations, modifications, and alternatives.

In an embodiment, singulated device(s) 1220 can be couple to at least one portion of the package surface region. In a specific embodiment, the singulated device(s) 1220 can be coupled such that the vertical bond pad(s) of the singulated device(s) 1220 are configured horizontally. The singulated device(s) 1220 can be rotated 90 degrees and mounted on package 1210. The singulated device can also be configured in other orientations while being mounted on package 1210. In a specific embodiment, at least one sensor or electronic device having bond pad(s) 1221 can be coupled to at least a portion of the package surface region. Of course, there can be other variations, modifications, and alternatives.

In an embodiment, interconnections 1230 can be formed within a vicinity of the vertical bond pad(s) or bond pad(s) and at least one portion of the package surface region. In a specific embodiment, interconnections 1230 can be formed within a vicinity of the bond pads and at least one portion of the ASIC material 1211. In a specific embodiment, interconnections 1230 can be formed via a wire bonding process, which can include ball bonding, wedge bonding, and other bonding processes. Those of ordinary skill in the art will recognize other variations, modifications, and alternatives.

In an embodiment, an enclosure can be formed overlying devices 1220 and 1221, interconnections 1230, and package 1210. The enclosure can include a wafer level packaging (WLP) material. In a specific embodiment, the WLP materials can include a wafer substrate WLP material, a thin film WLP material, or other materials and combinations thereof. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 13:
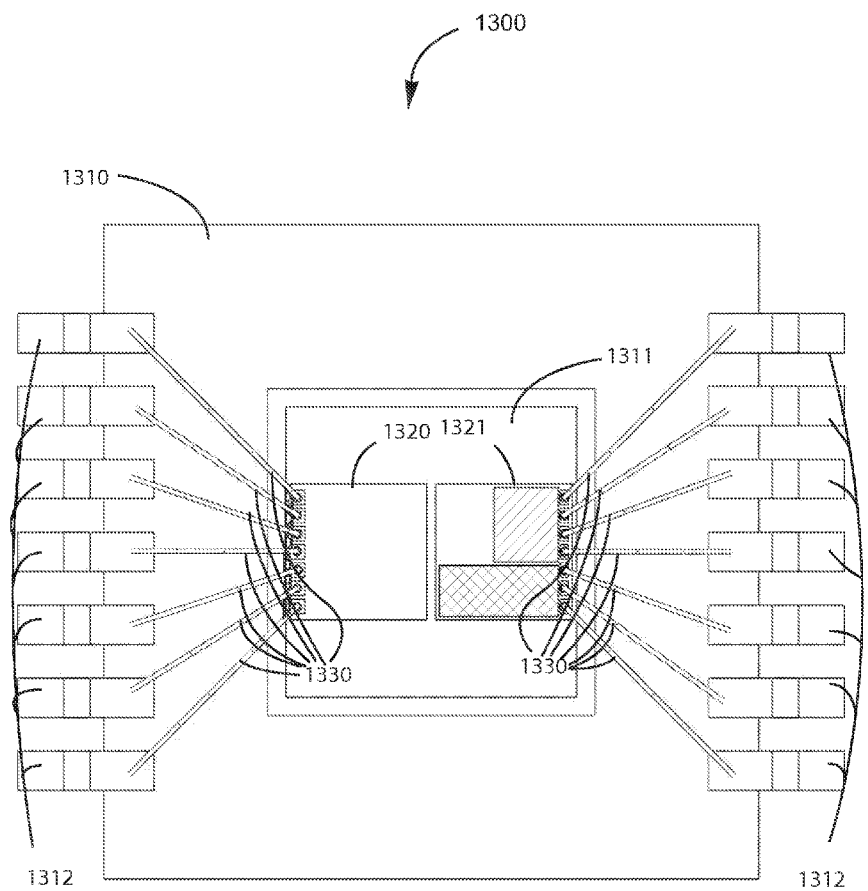
FIG. 13 is a simplified side diagram of a sensor device or electronic device according to an embodiment of the present invention.

FIG. 13 is a simplified side diagram of a sensor device or electronic device according to an embodiment of the present invention. This diagram is merely an example, which should not unduly limit the scope of the claims herein. One of ordinary skill in the art would recognize many other variations, modifications, and alternatives. As shown, device 1300 includes a package 1310, at least one singulated device having vertical bond pad(s) 1320, and at last one interconnection 1330. In an embodiment, FIG. 13 can represent device after the coupling process between the package and the singulated device(s). Those skilled in the art will recognize other variations, modifications, and alternatives.

In an embodiment, package 1310 can have a package surface region. In a specific embodiment, the package can be a substrate package or a lead frame package. The package can have at least one interconnection leg 1312 and/or an application specific integrated circuit (ASIC) material 1311 disposed overlying at least one portion of the package surface region. In further embodiments, the substrate can have a silicon, single crystal silicon, or polycrystalline silicon material. Those skilled in the art will recognize other variations, modifications, and alternatives.

In an embodiment, singulated device(s) 1320 can be couple to at least one portion of the package surface region. In a specific embodiment, the singulated device(s) 1320 can be coupled such that the vertical bond pad(s) of the singulated device(s) 1320 are configured horizontally. The singulated device(s) 1320 can be rotated 90 degrees and mounted on package 1310. The singulated device can also be configured in other orientations while being mounted on package 1310. In a specific embodiment, at least one sensor or electronic device having bond pad(s) 1321 can be coupled to at least a portion of the package surface region. Of course, there can be other variations, modifications, and alternatives.

In an embodiment, interconnections 1330 can be formed within a vicinity of the vertical bond pad(s) or bond pad(s) and at least one portion of the package surface region. In a specific embodiment, interconnections 1330 can be formed within a vicinity of the bond pads and at least one portion of the ASIC material 1311. In a specific embodiment, interconnections 1330 can be formed via a wire bonding process, which can include ball bonding, wedge bonding, and other bonding processes. Those of ordinary skill in the art will recognize other variations, modifications, and alternatives.

In an embodiment, an enclosure can be formed overlying devices 1320 and 1321, interconnections 1330, and package 1310. The enclosure can include a wafer level packaging (WLP) material. In a specific embodiment, the WLP materials can include a wafer substrate WLP material, a thin film WLP material, or other materials and combinations thereof. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 14:
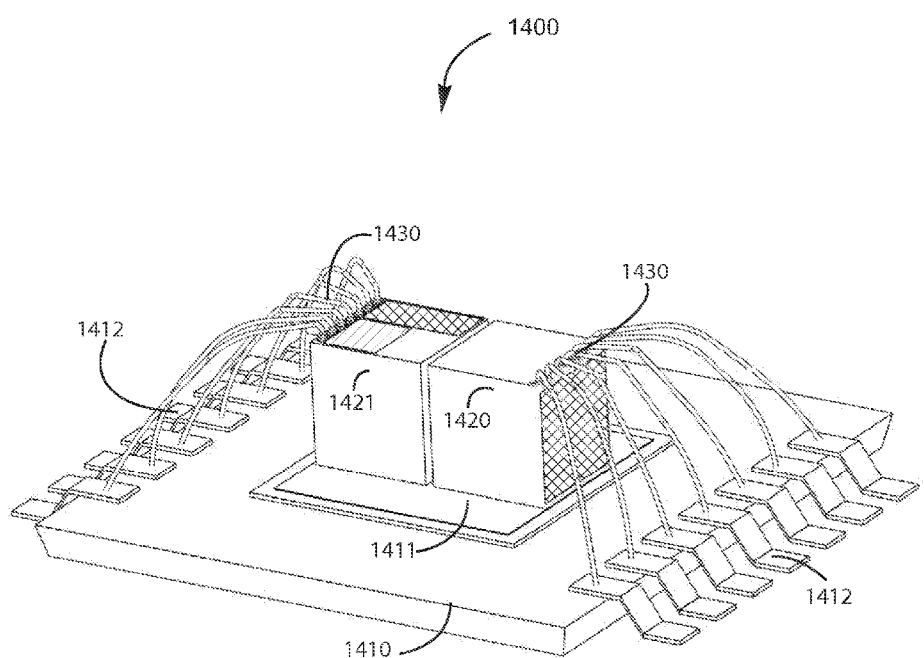
FIG. 14 is a simplified side diagram of a sensor device or electronic device according to an embodiment of the present invention.

FIG. 14 is a simplified side diagram of a sensor device or electronic device according to an embodiment of the present invention. This diagram is merely an example, which should not unduly limit the scope of the claims herein. One of ordinary skill in the art would recognize many other variations, modifications, and alternatives. As shown, device 1400 includes a package 1410, at least one singulated device having vertical bond pad(s) 1420, and at last one interconnection 1430. In an embodiment, FIG. 14 can represent device after the coupling process between the package and the singulated device(s). Those skilled in the art will recognize other variations, modifications, and alternatives.

In an embodiment, package 1410 can have a package surface region. In a specific embodiment, the package can be a substrate package or a lead frame package. The package can have at least one interconnection leg 1412 and/or an application specific integrated circuit (ASIC) material 1411 disposed overlying at least one portion of the package surface region. In further embodiments, the substrate can have a silicon, single crystal silicon, or polycrystalline silicon material. Those skilled in the art will recognize other variations, modifications, and alternatives.

In an embodiment, singulated device(s) 1420 can be couple to at least one portion of the package surface region. In a specific embodiment, the singulated device(s) 1420 can be coupled such that the vertical bond pad(s) of the singulated device(s) 1420 are configured horizontally. The singulated device(s) 1420 can be rotated 90 degrees and mounted on package 1410. The singulated device can also be configured in other orientations while being mounted on package 1410. In a specific embodiment, at least one sensor or electronic device having bond pad(s) 1421 can be coupled to at least a portion of the package surface region. Of course, there can be other variations, modifications, and alternatives.

In an embodiment, interconnections 1430 can be formed within a vicinity of the vertical bond pad(s) or bond pad(s) and at least one portion of the package surface region. In a specific embodiment, interconnections 1430 can be formed within a vicinity of the bond pads and at least one portion of the ASIC material 1411. In a specific embodiment, interconnections 1430 can be formed via a wire bonding process, which can include ball bonding, wedge bonding, and other bonding processes. Those of ordinary skill in the art will recognize other variations, modifications, and alternatives.

In an embodiment, an enclosure can be formed overlying devices 1420 and 1421, interconnections 1430, and package 1410. The enclosure can include a wafer level packaging (WLP) material. In a specific embodiment, the WLP materials can include a wafer substrate WLP material, a thin film WLP material, or other materials and combinations thereof. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 15:
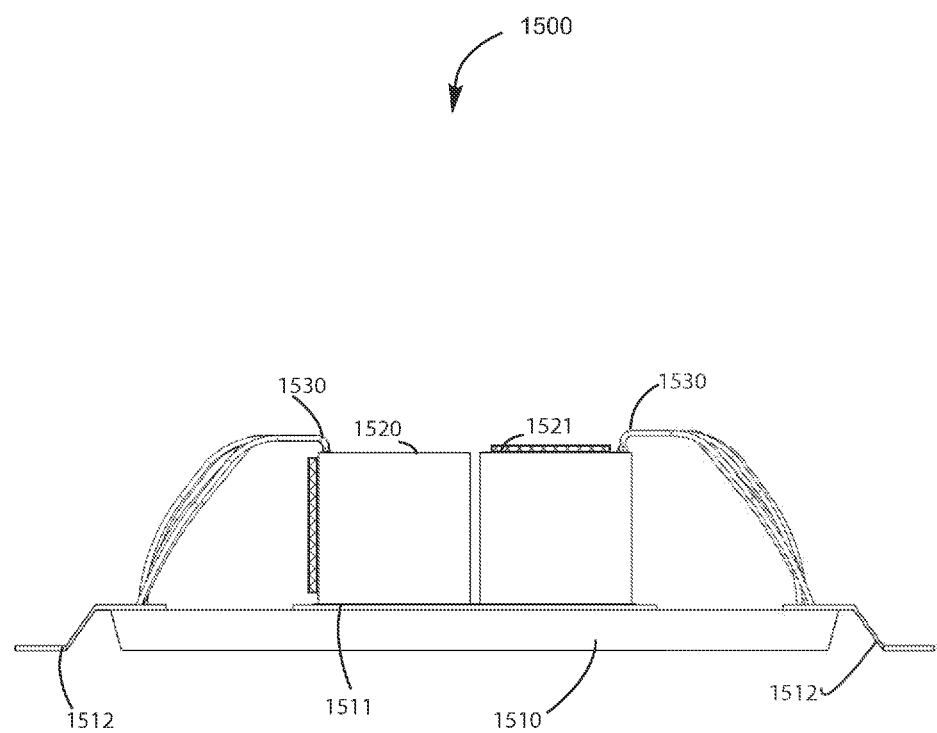
FIG. 15 is a simplified top diagram of a sensor device or electronic device according to an embodiment of the present invention.

FIG. 15 is a simplified side diagram of a sensor device or electronic device according to an embodiment of the present invention. This diagram is merely an example, which should not unduly limit the scope of the claims herein. One of ordinary skill in the art would recognize many other variations, modifications, and alternatives. As shown, device 1500 includes a package 1510, at least one singulated device having vertical bond pad(s) 1520, and at last one interconnection 1530. In an embodiment, FIG. 15 can represent device after the coupling process between the package and the singulated device(s). Those skilled in the art will recognize other variations, modifications, and alternatives.

In an embodiment, package 1510 can have a package surface region. In a specific embodiment, the package can be a substrate package or a lead frame package. The package can have at least one interconnection leg 1512 and/or an application specific integrated circuit (ASIC) material 1511 disposed overlying at least one portion of the package surface region. In further embodiments, the substrate can have a silicon, single crystal silicon, or polycrystalline silicon material. Those skilled in the art will recognize other variations, modifications, and alternatives.

In an embodiment, singulated device(s) 1520 can be couple to at least one portion of the package surface region. In a specific embodiment, the singulated device(s) 1520 can be coupled such that the vertical bond pad(s) of the singulated device(s) 1520 are configured horizontally. The singulated device(s) 1520 can be rotated 90 degrees and mounted on package 1510. The singulated device can also be configured in other orientations while being mounted on package 1510. In a specific embodiment, at least one sensor or electronic device having bond pad(s) 1521 can be coupled to at least a portion of the package surface region. Of course, there can be other variations, modifications, and alternatives.

In an embodiment, interconnections 1530 can be formed within a vicinity of the vertical bond pad(s) or bond pad(s) and at least one portion of the package surface region. In a specific embodiment, interconnections 1530 can be formed within a vicinity of the bond pads and at least one portion of the ASIC material 1511. In a specific embodiment, interconnections 1530 can be formed via a wire bonding process, which can include ball bonding, wedge bonding, and other bonding processes. Those of ordinary skill in the art will recognize other variations, modifications, and alternatives.

In an embodiment, an enclosure can be formed overlying devices 1520 and 1521, interconnections 1530, and package 1510. The enclosure can include a wafer level packaging (WLP) material. In a specific embodiment, the WLP materials can include a wafer substrate WLP material, a thin film WLP material, or other materials and combinations thereof. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application.

Figure 16:
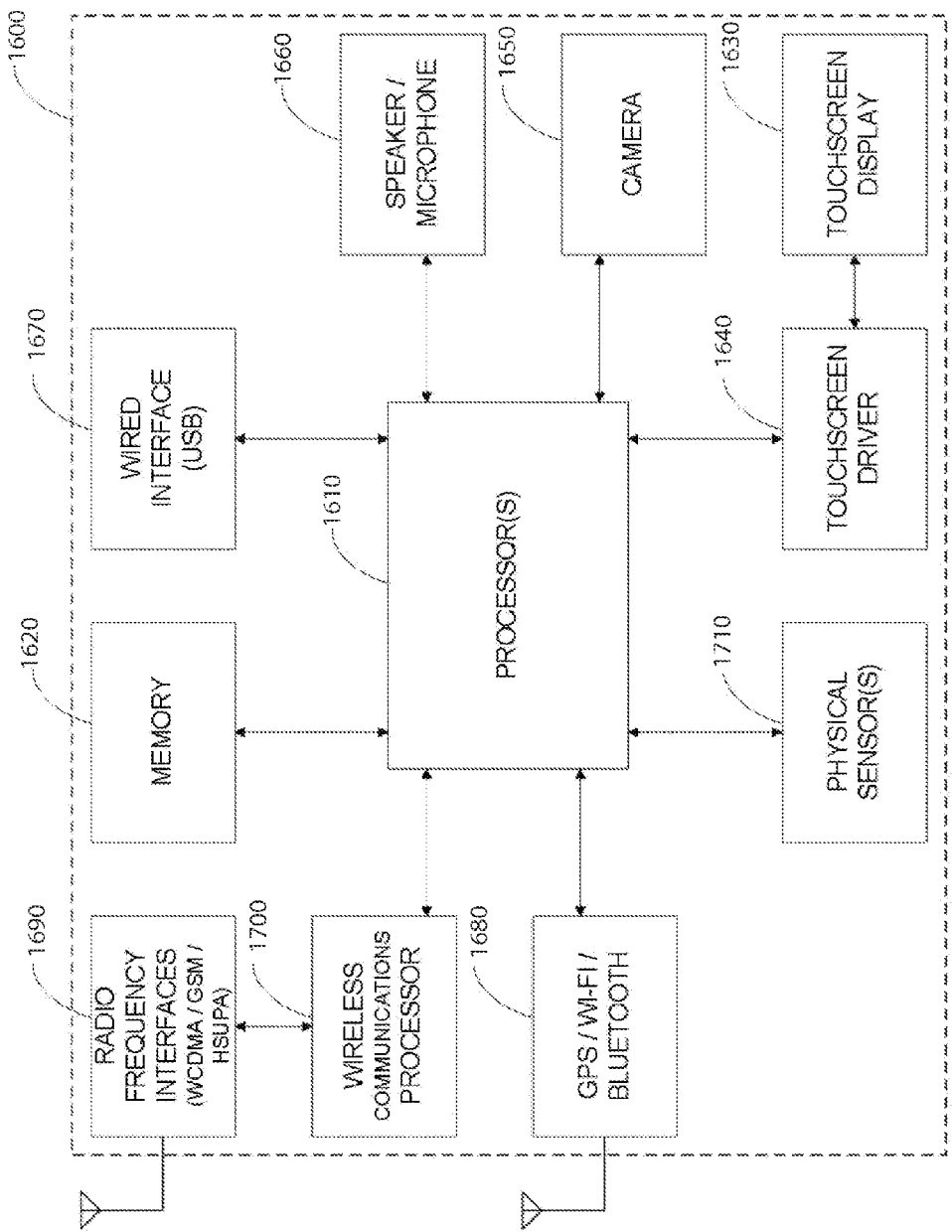
FIG. 16 is a simplified block diagram of a device incorporating various embodiments of the present invention.

FIG. 16 illustrates a functional block diagram of various embodiments of the present invention. In FIG. 16, a computing device 1600 typically includes an applications processor 1610, memory 1620, a touch screen display 1630 and driver 1640, an image acquisition device 1650, audio input/output devices 1660, and the like. Additional communications from and to computing device are typically provided by via a wired interface 1670, a GPS/Wi-Fi/Bluetooth interface 1680, RF interfaces 1690 and driver 1700, and the like. Also included in various embodiments are physical sensors 1710.

In various embodiments, computing device 1600 may be a hand-held computing device (e.g. Apple iPad, Apple iTouch, Dell Mini slate/Streak, Lenovo Skylight/IdeaPad, Samsung Galaxy Tab, Asus EEE series, HP Slate, Notion Ink Adam), a portable telephone (e.g. Apple iPhone, Motorola Droid, Google Nexus One, HTC Incredible/EVO 4G, Palm Pre series, Nokia N900), a portable computer (e.g. netbook, laptop), a media player (e.g. Microsoft Zune, Apple iPod), a reading device (e.g. Amazon Kindle, Barnes and Noble Nook), or the like.

Typically, computing device 1600 may include one or more processors 1610. Such processors 1610 may also be termed application processors, and may include a processor core, a video/graphics core, and other cores. Processors 1610 may be a processor from Apple (A4), Intel (Atom), NVidia (Tegra 2), Marvell (Armada), Qualcomm (Snapdragon), Samsung, TI (OMAP), or the like. In various embodiments, the processor core may be an Intel processor, an ARM Holdings processor such as the Cortex-A, -M, -R or ARM series processors, or the like. Further, in various embodiments, the video/graphics core may be an Imagination Technologies processor PowerVR-SGX, -MBX, -VGX graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 1620 may include different types of memory (including memory controllers), such as flash memory (e.g. NOR, NAND), pseudo SRAM, DDR SDRAM, or the like. Memory 1620 may be fixed within computing device 1600 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, touch screen display 1630 and driver 1640 may be based upon a variety of later-developed or current touch screen technology including resistive displays, capacitive displays, optical sensor displays, electromagnetic resonance, or the like. Additionally, touch screen display 1630 may include single touch or multiple-touch sensing capability. Any later-developed or conventional output display technology may be used for the output display, such as TFT-LCD, OLED, Plasma, trans-reflective (Pixel Qi), electronic ink (e.g. electrophoretic, electrowetting, interferometric modulating). In various embodiments, the resolution of such displays and the resolution of such touch sensors may be set based upon engineering or non-engineering factors (e.g. sales, marketing). In some embodiments of the present invention, a display output port, such as an HDMI-based port or DVI-based port may also be included.

In some embodiments of the present invention, image capture device 1650 may include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, or the like.

In various embodiments, audio input/output 1660 may include conventional microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 1610 to enable the user to operate computing device 1600 by stating voice commands. Additionally, a speech engine may be provided in various embodiments to enable computing device 1600 to provide audio status messages, audio response messages, or the like.

In various embodiments, wired interface 1670 may be used to provide data transfers between computing device 1600 and an external source, such as a computer, a remote server, a storage network, another computing device 1600, or the like. Such data may include application data, operating system data, firmware, or the like. Embodiments may include any later-developed or conventional physical interface/protocol, such as: USB 2.0, 3.0, micro USB, mini USB, Firewire, Apple iPod connector, Ethernet, POTS, or the like. Additionally, software that enables communications over such networks is typically provided.

In various embodiments, a wireless interface 1680 may also be provided to provide wireless data transfers between computing device 1600 and external sources, such as computers, storage networks, headphones, microphones, cameras, or the like. As illustrated in FIG. 16, wireless protocols may include Wi-Fi (e.g. IEEE 802.11a/b/g/n, WiMax), Bluetooth, IR and the like.

GPS receiving capability may also be included in various embodiments of the present invention, however is not required. As illustrated in FIG. 16, GPS functionality is included as part of wireless interface 1680 merely for sake of convenience, although in implementation, such functionality is currently performed by circuitry that is distinct from the Wi-Fi circuitry and distinct from the Bluetooth circuitry.

Additional wireless communications may be provided via RF interfaces 1690 and drivers 1700 in various embodiments. In various embodiments, RF interfaces 1690 may support any future-developed or conventional radio frequency communications protocol, such as CDMA-based protocols (e.g. WCDMA), GSM-based protocols, HSUPA-based protocols, or the like. In the embodiments illustrated, driver 1700 is illustrated as being distinct from applications processor 1610. However, in some embodiments, these functionalities are provided upon a single IC package, for example the Marvel PXA330 processor, and the like. It is contemplated that some embodiments of computing device 1600 need not include the RF functionality provided by RF interface 1690 and driver 1700.

FIG. 16 also illustrates computing device 1600 to include physical sensors 1710. In various embodiments of the present invention, physical sensors 1710 can be single axis or multi-axis Micro-Electro-Mechanical Systems (MEMS) based devices being developed by M-cube, the assignee of the present patent application. Physical sensors 1710 can include accelerometers, gyroscopes, pressure sensors, magnetic field sensors, bio sensors, and the like. In various embodiments, physical sensors 1710 may be fabricated using the combined CMOS MEMS fabrication techniques described above. More specifically, one or more MEMS devices may be fabricated approximately in parallel using common masks, layers, and processes, above a substrate. In various embodiments, the substrate may be on top of a CMOS device. Both the CMOS and MEMS device may be fabricated using foundry-compatible processes. In other embodiments of the present invention, conventional physical sensors 1710 from Bosch, STMicroelectronics, Analog Devices, Kionix or the like may be used.

In various embodiments, any number of future developed or current operating systems may be supported, such as iPhone OS (e.g. iOS), WindowsMobile (e.g. 7), Google Android (e.g. 2.2), Symbian, or the like. In various embodiments of the present invention, the operating system may be a multi-threaded multi-tasking operating system. Accordingly, inputs and/or outputs from and to touch screen display 1630 and driver 1640 and inputs/or outputs to physical sensors 1710 may be processed in parallel processing threads. In other embodiments, such events or outputs may be processed serially, or the like. Inputs and outputs from other functional blocks may also be processed in parallel or serially, in other embodiments of the present invention, such as image acquisition device 1650 and physical sensors 1710.

FIG. 16 is representative of one computing device 1600 capable of embodying the present invention. It will be readily apparent to one of ordinary skill in the art that many other hardware and software configurations are suitable for use with the present invention. Embodiments of the present invention may include at least some but need not include all of the functional blocks illustrated in FIG. 16. For example, in various embodiments, computing device 1600 may lack image acquisition unit 1650, or RF interface 1690 and/or driver 1700, or GPS capability, or the like. Additional functions may also be added to various embodiments of computing device 1600, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

These diagrams are merely examples, which should not unduly limit the scope of the claims herein. In light of the present invention disclosure, one of ordinary skill in the art would recognize many other variations, modifications, and alternatives. For example, various steps outlined above may be added, removed, modified, rearranged, repeated, and/or overlapped, as contemplated within the scope of the invention. It is also understood that the examples and embodiments described herein are for illustrative purposes only and that various modifications or changes in light thereof will be suggested to persons skilled in the art and are to be included within the spirit and purview of this process and scope of the appended claims.

What is claimed is:

1. A method for fabricating an integrated device, the method comprising:

providing a substrate having a surface region;

forming at least one integrated device provided on a first region overlying the surface region, the at least one integrated device having at least one contact region, the first region having a first surface region, the at least one integrated device including one or more sensors and/or one or more electronic devices;

forming at least one trench structure within at least one portion of the first region;

forming a dielectric material overlying the first region and the at least one trench structure;

removing at least one portion of the dielectric material within a vicinity of the at least one contact region;

forming a conduction material overlying the dielectric material, the at least one trench structure, and the at least one contact region;

removing at least one portion of the conduction material within a vicinity of the at least one contact region and the at least one trench structure to form at least one bonding structure;

singulating the resulting device within a vicinity of the at least one bonding structure to form at least one singulated integrated device having at least one vertical bond pad;

coupling the at least one singulated integrated device to a package, the package having a package surface region, the at least one singulated device being coupled to the package surface region such that the at least one vertical bond pad is configured horizontally; and forming at least one interconnection between the at least one vertical bond pad and at least a portion of the package surface region.

2. The method of claim 1 wherein the at least one integrated device comprises a nickel-iron material.

3. The method of claim 1 wherein the electronic devices comprise CMOS integrated circuit devices.

4. The method of claim 1 wherein the sensors comprise MEMS devices.

5. The method of claim 1 wherein the sensors comprise magnetoresistance devices.

6. The method of claim 5 wherein the magnetoresistance devices comprise anisotropic magnetoresistance (AMR), ordinary magnetoresistance (OMR), giant magnetoresistance (GMR), or tunnel junction magneto resistance (TMR) devices.

7. The method of claim 1 wherein the at least one trench structure is formed from a wet etching, dry etching, deep reactive-ion etching (DRIE), or mechanical process.

8. The method of claim 1 wherein the removing of at least one portion of the dielectric material and the removing of at least one portion of the conduction material comprise a wet etching, dry etching, or mechanical process.

9. The method of claim 1 wherein the singulating of the resulting device comprises a dicing, an etching, or a laser scribing process.

10. The method of claim 1 wherein the package is a substrate package or a lead frame package.

11. The method of claim 1 wherein the at least one interconnection is formed via a wire bonding process.

12. A method for fabricating an integrated device, the method comprising:

providing a substrate having a surface region;

forming at least one integrated device provided on a first region overlying the surface region, the at least one integrated device having at least one contact region, the first region having a first surface region, the at least one integrated device including one or more sensors and/or one or more electronic devices;

forming at least one trench structure within at least one portion of the first region, the at least one trench structure being formed via a deep reactive-ion etching (DRIE) process, the trench sidewalls having slopes greater than 90 degrees;

forming a dielectric material overlying the first region and the at least one trench structure;

removing at least one portion of the dielectric material within a vicinity of the at least one contact region;

forming a conduction material overlying the dielectric material, the at least one trench structure, and the at least one contact region;

removing at least one portion of the conduction material within a vicinity of the at least one contact region and the at least one trench structure to form at least one bonding structure;

singulating the resulting device within a vicinity of the at least one bonding structure to form at least one singulated integrated device having at least one vertical bond pad;

coupling the at least one singulated integrated device to a package, the package having a package surface region, the at least one singulated device being rotated 90 degrees and being coupled to the package surface region such that the at least one vertical bond pad is configured horizontally;

forming at least one interconnection between the at least one vertical bond pad and at least a portion of the package surface region; and forming an encapsulation overlying the at least one singulated integrated device, the at least one interconnection, and the package.

13. The method of claim 12 wherein the at least one integrated device comprises a nickel-iron material.

14. The method of claim 12 wherein the electronic devices comprise CMOS integrated circuit devices.

15. The method of claim 12 wherein the sensors comprise MEMS devices.

16. The method of claim 12 wherein the sensors comprise magnetoresistance devices.

17. The method of claim 16 wherein the magnetoresistance devices comprise anisotropic magnetoresistance (AMR), ordinary magnetoresistance (OMR), giant magnetoresistance (GMR), or tunnel junction magnetoresistance (TMR) devices.

18. The method of claim 12 wherein the at least one trench structure is formed from a wet etching, dry etching, deep reactive-ion etching (DRIE), or mechanical process.

19. The method of claim 12 wherein the removing of at least one portion of the dielectric material and the removing of at least one portion of the conduction material comprise a wet etching, dry etching, or mechanical process.

20. The method of claim 12 wherein the singulating of the resulting device comprises a dicing, an etching, or a laser scribing process.

21. The method of claim 12 wherein the package is a substrate package or a lead frame package.

22. The method of claim 12 wherein the at least one interconnection is formed via a wire bonding process.

* * * * *